(12) United States Patent
Sakakibara et al.

(10) Patent No.: US 8,722,306 B2
(45) Date of Patent: May 13, 2014

(54) RADIATION-SENSITIVE RESIN COMPOSITION

(75) Inventors: Hirokazu Sakakibara, Tokyo (JP); Makoto Shimizu, Tokyo (JP); Takehiko Naruoka, Tokyo (JP); Tomoki Nagai, Tokyo (JP); Yoshifumi Oizumi, Tokyo (JP)

(73) Assignee: JSR Corporation, Tokyo (JP)

( * ) Notice: Subject to any disclaimer, the term of this patent is extended or adjusted under 35 U.S.C. 154(b) by 54 days.

(21) Appl. No.: 12/602,769

(22) PCT Filed: May 26, 2008

(86) PCT No.: PCT/JP2008/059625
§ 371 (c)(1),
(2), (4) Date: Dec. 3, 2009

(87) PCT Pub. No.: WO2008/149701
PCT Pub. Date: Dec. 11, 2008

(65) Prior Publication Data
US 2010/0178608 A1    Jul. 15, 2010

(30) Foreign Application Priority Data
Jun. 5, 2007 (JP) ................................. 2007-149717

(51) Int. Cl.
*G03F 7/004* (2006.01)
*G03F 7/028* (2006.01)
*G03F 7/039* (2006.01)

(52) U.S. Cl.
USPC .......................... 430/270.1; 430/910; 430/921

(58) Field of Classification Search
USPC ....................................... 430/270.1, 326, 910
See application file for complete search history.

(56) References Cited

U.S. PATENT DOCUMENTS

| | | | |
|---|---|---|---|
| 5,356,740 A | 10/1994 | Steinmann | |
| 6,280,898 B1 | 8/2001 | Hasegawa et al. | |
| 6,462,158 B1 | 10/2002 | Miwa et al. | |
| 2001/0026901 A1 | 10/2001 | Maeda et al. | |
| 2003/0108809 A1 | 6/2003 | Sato | |
| 2006/0141383 A1 | 6/2006 | Miyamatsu et al. | |
| 2007/0042292 A1 | 2/2007 | Yoneda et al. | |

FOREIGN PATENT DOCUMENTS

| | | |
|---|---|---|
| EP | 1586570 | 10/2005 |
| EP | 1757980 | 2/2007 |
| JP | 2000-026446 | 1/2000 |
| JP | 2000-159758 | 6/2000 |
| JP | 2001-064325 | 3/2001 |
| JP | 2001-242627 | 9/2001 |
| JP | 2002-145955 | 5/2002 |
| JP | 2002-201232 | 7/2002 |
| JP | 2002-363123 | 12/2002 |
| JP | 2003-076022 | 3/2003 |
| JP | 2003-107710 | 4/2003 |
| JP | 2005-041857 | 2/2005 |
| JP | 2007-079552 | 3/2007 |
| TW | 154658 | 3/1991 |
| TW | 193240 | 10/1992 |
| TW | 221715 | 3/1994 |
| WO | WO 00/01684 | 1/2000 |
| WO | WO 2004/065377 | 8/2004 |

OTHER PUBLICATIONS

Taiwanese Office Action for corresponding TW Application No. 097120934, Jul. 15, 2013.

*Primary Examiner* — Anca Eoff
(74) *Attorney, Agent, or Firm* — Ditthavong Mori & Steiner, P.C.

(57) ABSTRACT

A radiation-sensitive resin composition includes a resin (A1) that includes a repeating unit shown by the following formula (1-1) and a repeating unit shown by the following formula (1-2), and a radiation-sensitive acid generator (B). The radiation-sensitive resin composition exhibits excellent sensitivity, and can reduce a mask error factor (MEEF).

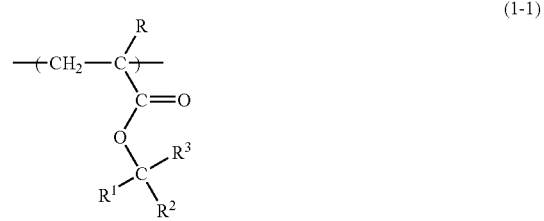

(1-1)

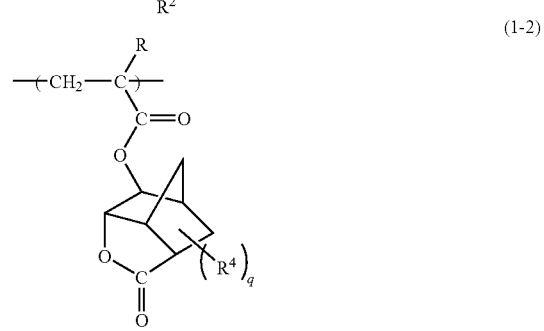

(1-2)

wherein $R^1$, $R^2$, and $R^3$ individually represent a linear or branched alkyl group having 1 to 4 carbon atoms, $R^4$ represents a hydrogen atom, a linear or branched alkyl group having 2 to 4 carbon atoms, a linear or branched fluoroalkyl group having 1 to 4 carbon atoms, or a linear or branched alkoxy group having 1 to 4 carbon atoms, and q represents an integer from 0 to 3.

7 Claims, No Drawings

RADIATION-SENSITIVE RESIN COMPOSITION

TECHNICAL FIELD

The present invention relates to a radiation-sensitive resin composition. More particularly, the present invention relates to a radiation-sensitive resin composition that can reduce a mask error factor, and may be suitably used as a chemically-amplified resist useful for microfabrication utilizing various types of radiation (e.g., deep ultraviolet rays such as KrF excimer laser light or ArF excimer laser light, X-rays such as synchrotron radiation, or charged particle rays such as electron beams).

BACKGROUND ART

In the field of microfabrication represented by production of integrated circuit devices, lithographic technology that enables microfabrication with a line width of about 65 nm or less using an ArF excimer laser (wavelength: 193 nm), an $F_2$ excimer laser (wavelength: 157 nm), or the like has been desired in order to achieve a higher degree of integration. As a radiation-sensitive resin composition that is suitable for excimer laser irradiation, a number of chemically-amplified radiation-sensitive compositions that utilize a chemical amplification effect due to a component having an acid-dissociable functional group and an acid generator (i.e., a component that generates an acid upon irradiation) have been proposed. For example, a photoresist polymer compound that contains a polymer having a specific structure that contains a monomer unit having a norbornane derivative as a resin component is known (refer to Patent Documents 1 and 2). A radiation-sensitive resin composition that contains an optically active compound in addition to a component having an acid-dissociable functional group and an acid generator to improve sensitivity and resolution has also been disclosed (refer to Patent Document 3).

Patent Document 1: JP-A-2002-201232
Patent Document 2: JP-A-2002-145955
Patent Document 3: JP-A-2002-363123

However, since a higher degree of integration has been desired in the field of semiconductor devices, an improvement in sensitivity and a decrease in mask error factor (hereinafter may be referred to as "MEEF") have been desired for a radiation-sensitive resin composition used as a resist. Therefore, development of a radiation-sensitive resin composition that can maintain excellent sensitivity and a small MEEF has become necessary. The term "MEEF" means a value obtained by dividing the amount of change ($\Delta CD$) in a pattern transferred to a resist formed on a wafer by the amount of change ($\Delta CD$) in a pattern formed on a mask, and is indicated by "MEEF=$\Delta CD$ (dimensional difference in pattern transferred to resist)/$\Delta CD$ (dimensional difference in mask)". It becomes more difficult to transfer a pattern conforming to the dimensions of the mask as the MEEF becomes more different from one. It is preferable that the MEEF be close to one in order to accurately reproduce the dimensions of the mask.

DISCLOSURE OF THE INVENTION

Problems to be Solved by the Invention

The present invention was conceived in view of the above situation. An object of the present invention is to provide a radiation-sensitive resin composition used as a chemically-amplified resist that exhibits excellent sensitivity and can maintain a favorable MEEF.

Means for Solving the Problems

The inventors of the present invention conducted studies to obtain a radiation-sensitive resin composition that can reduce the MEEF (i.e., a value obtained by dividing the amount of change in a pattern transferred to a resist formed on a wafer by the amount of change in a pattern formed on a mask), and found that a radiation-sensitive resin composition that includes a specific resin component and an acid generator can reduce the MEEF. According to one aspect of the present invention, there is provided a radiation-sensitive resin composition comprising a resin (A1) that comprises a repeating unit shown by the following formula (1-1) and a repeating unit shown by the following formula (1-2), and a radiation-sensitive acid generator (B), the total content of the repeating unit shown by the formula (1-1) and the repeating unit shown by the formula (1-2) in the resin (A1) being more than 80 mol %, and the content of the repeating unit shown by the formula (1-1) in the resin (A1) being more than 30 mol % and 90 mol % or less,

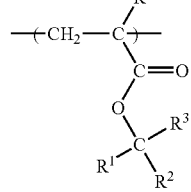
(1-1)

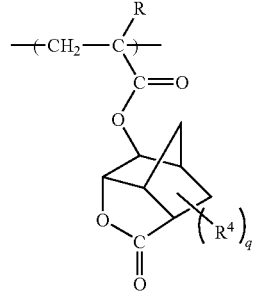
(1-2)

wherein R represents a hydrogen atom, a methyl group, or a trifluoromethyl group, $R^1$, $R^2$, and $R^3$ individually represent a linear or branched alkyl group having 1 to 4 carbon atoms, $R^4$ represents a hydrogen atom, a linear or branched alkyl group having 2 to 4 carbon atoms, a linear or branched fluoroalkyl group having 1 to 4 carbon atoms, or a linear or branched alkoxy group having 1 to 4 carbon atoms, and q represents an integer from 0 to 3.

In the above radiation-sensitive resin composition, the resin (A1) may consist of the repeating unit shown by the formula (1-1) and the repeating unit shown by the formula (1-2), and the content of the repeating unit shown by the formula (1-1) in the resin (A1) may be 40 to 70 mol %.

According to another aspect of the present invention, there is provided a radiation-sensitive resin composition comprising a resin (A2) that comprises a repeating unit shown by the following formula (1-1), a repeating unit shown by the following formula (1-2), and a repeating unit shown by the following formula (1-3), and a radiation-sensitive acid generator (B),

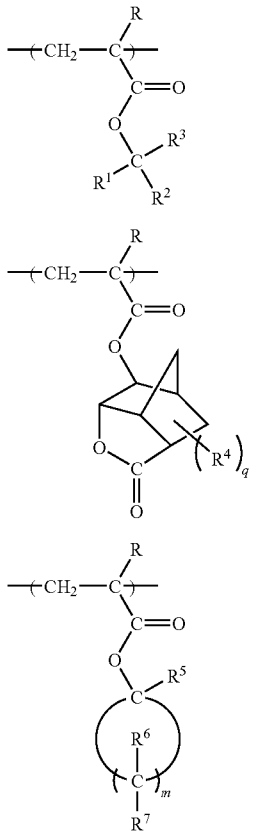

wherein R represents a hydrogen atom, a methyl group, or a trifluoromethyl group, $R^1$, $R^2$, and $R^3$ individually represent a linear or branched alkyl group having 1 to 4 carbon atoms, $R^4$ represents a hydrogen atom, a linear or branched alkyl group having 1 to 4 carbon atoms, a linear or branched fluoroalkyl group having 1 to 4 carbon atoms, or a linear or branched alkoxy group having 1 to 4 carbon atoms, q represents an integer from 0 to 3, $R^5$ represents a linear or branched alkyl group having 1 to 4 carbon atoms, $R^6$ and $R^7$ individually represent a hydrogen atom or a linear or branched alkyl group having 1 to 4 carbon atoms, and m represents an integer from 3 to 7.

In the above radiation-sensitive resin composition, the content of the repeating unit shown by the formula (1-1) in the resin (A2) may be 10 to 70 mol %.

In the above radiation-sensitive resin compositions, the radiation-sensitive acid generator (B) may comprise a compound shown by the following formula (2),

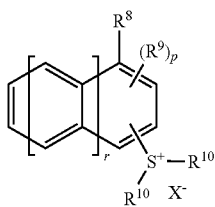

wherein $R^8$ represents a hydrogen atom, a hydroxyl group, a linear or branched alkyl group having 1 to 10 carbon atoms, a substituted or unsubstituted alicyclic hydrocarbon group having 4 to 12 carbon atoms, a linear or branched alkoxyl group having 1 to 10 carbon atoms, or a linear or branched alkoxycarbonyl group having 2 to 11 carbon atoms, $R^9$ represents a hydrogen atom or a linear or branched alkyl group having 1 to 10 carbon atoms, p represents an integer from 0 to 3, $R^{10}$ individually represent a linear or branched alkyl group having 1 to 10 carbon atoms, a substituted or unsubstituted phenyl group, or a substituted or unsubstituted naphthyl group, or bond to form a substituted or unsubstituted divalent group having 2 to 10 carbon atoms, r represents an integer from 0 to 2, $X^-$ represents $R^{11}C_nF_{2n}SO_3^-$, $R^{11}CH_2C_nF_{2n}SO_3^-$, or $C_nF_{2n+1}SO_3^-$ (wherein $R^{11}$ represents a substituted or unsubstituted alicyclic hydrocarbon group having 3 to 12 carbon atoms, and n represents an integer from 1 to 10).

Effect of the Invention

Since the radiation-sensitive resin composition according to the present invention includes a resin that contains the repeating unit shown by the formula (1-1) as an essential component and the radiation-sensitive acid generator (B) that includes the compound shown by the formula (2), diffusion of an acid can be suppressed due to an increase in density of the resist film during a heat treatment that causes a deprotection reaction after the acid generator (B) has generated an acid upon irradiation. Therefore, a radiation-sensitive resin composition that can be used as a chemically-amplified resist sensitive to active radiation (particularly deep ultraviolet rays represented by ArF excimer laser light (wavelength: 193 nm)) that maintains favorable sensitivity and a favorable MEEF can be provided.

BEST MODE FOR CARRYING OUT THE INVENTION

Embodiments of the present invention are described in detail below. Note that the present invention is not limited to the following embodiments. Various modifications, improvements, and the like may be appropriately made with regard to the design without departing from the scope of the present invention based on common knowledge of a person skilled in the art.

Resin (A)

The resin that is included in the radiation-sensitive resin composition according to one embodiment of the present invention is the resin (A1) that includes the repeating unit shown by the formula (1-1) and the repeating unit shown by the formula (1-2), the total content of the repeating unit shown by the formula (1-1) and the repeating unit shown by the formula (1-2) in the resin (A1) being more than 80 mol %, and the content of the repeating unit shown by the formula (1-1) in the resin (A1) being more than 30 mol % and 90 mol % or less, or the resin (A2) that includes the repeating unit shown by the formula (1-1), the repeating unit shown by the formula (1-2), and the repeating unit shown by the formula (1-3).

The resin included in the radiation-sensitive resin composition is preferably a two-component resin that consists of the repeating unit shown by the formula (1-1) and the repeating unit shown by the formula (1-2), or a three-component resin that consists of the repeating unit shown by the formula (1-1), the repeating unit shown by the formula (1-2), and the repeating unit shown by the formula (1-3).

Examples of the linear or branched alkyl groups having 1 to 4 carbon atoms represented by $R^1$, $R^2$, and $R^3$ in the formulas (1-1) and (1-2) include a methyl group, an ethyl group, an n-propyl group, an i-propyl group, a n-butyl group, a 2-methylpropyl group, a 1-methylpropyl group, a t-butyl group, and the like. It is particularly preferable that $R^1$, $R^2$, and $R^3$ be methyl groups since the size of the protecting group can be minimized, and a film density sufficient to suppress diffusion of an acid can be obtained.

Examples of the linear or branched alkyl group having 2 to 4 carbon atoms represented by $R^4$ in the formula (1-2) include an ethyl group, an n-propyl group, an i-propyl group, an n-butyl group, a 2-methylpropyl group, a 1-methylpropyl group, a t-butyl group, and the like.

Examples of the linear or branched fluoroalkyl group having 1 to 4 carbon atoms represented by $R^4$ in the formula (1-2) include groups obtained by replacing some or all of the hydrogen atoms of the above alkyl groups with a fluorine atom.

Examples of the linear or branched alkoxy group having 1 to 4 carbon atoms represented by $R^4$ in the formula (1-2) include a methoxy group, an ethoxy group, an n-propoxy group, an i-propoxy group, an n-butoxy group, a 2-methylpropoxy group, a 1-methylpropoxy group, a t-butoxygroup, and the like. q represents an integer from 0 to 3.

Examples of a preferable lactone skeleton include 5-oxo-4-oxatricyclo[4.2.1.0$^{3.7}$]nonane.

Examples of the linear or branched alkyl group having 1 to 4 carbon atoms represented by $R^5$ in the formula (1-3) include a methyl group, an ethyl group, an n-propyl group, an i-propyl group, an n-butyl group, a 2-methylpropyl group, a 1-methylpropyl group, a t-butyl group, and the like.

Examples of the linear or branched alkyl group having 1 to 4 carbon atoms represented by $R^6$ and $R^7$ include a methyl group, an ethyl group, an n-propyl group, an i-propyl group, an n-butyl group, a 2-methylpropyl group, a 1-methylpropyl group, a t-butyl group, and the like.

In the formula (1-3), it is particularly preferable that $R^5$ be a methyl group or an ethyl group, $R^6$ and $R^7$ be hydrogen atoms, and m be 4 or 5, since a film density sufficient to suppress diffusion of an acid can be obtained. The following formulas (1-3-1) to (1-3-4) illustrate particularly preferable examples of the repeating unit shown by the formula (1-3).

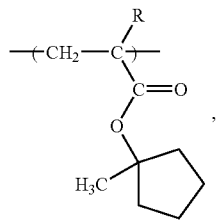

(1-3-1)

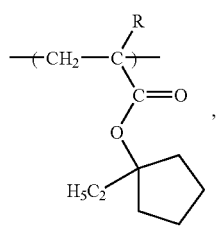

(1-3-2)

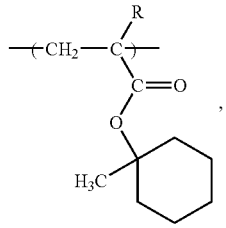

(1-3-3)

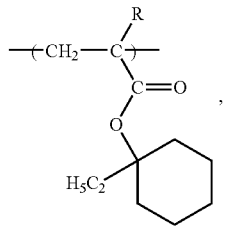

(1-3-4)

wherein R represents a hydrogen atom, a methyl group, or a trifluoromethyl group.

The resin (A1) and the resin (A2) may further include other repeating units. It is preferable that such other repeating units be repeating units derived from monomers having an acid-dissociable group such as 2-methyladamantan-2-yl (meth)acrylate, 2-ethyladamantan-2-yl (meth)acrylate, 2-n-propyladamantan-2-yl (meth)acrylate, 2-isopropyladamantan-2-yl (meth)acrylate, 1-(adamantan-1-yl)-1-methylethyl (meth)acrylate, 2-methylbicyclo[2.2.1]hept-2-yl (meth)acrylate, 2-ethylbicyclo[2.2.1]hept-2-yl (meth)acrylate, 8-methyltricyclo[5.2.1.0$^{2,6}$]dec-8-yl (meth)acrylate, 8-ethyltricyclo[5.2.1.0$^{2,6}$]dec-8-yl (meth)acrylate, 4-methyltetracyclo[6.2.1.1$^{3,6}$.0$^{2,7}$]dodec-4-yl (meth)acrylate, 4-ethyltetracyclo[6.2.1.1$^{3,6}$.0$^{2,7}$]dodec-4-yl (meth)acrylate, 1-(tetracyclo[6.2.1.1$^{3,6}$.0$^{2,7}$]dodec-4-yl)-1-methylethyl (meth)acrylate, 1-(adamantan-1-yl)-1-methylethyl (meth)acrylate, and 1,1-dicyclohexylethyl (meth)acrylate.

The total content of the repeating unit shown by the formula (1-1) and the repeating unit shown by the formula (1-2) in the resin (A1) is more than 80 mol %, and preferably 100 mol %, and the content of the repeating unit shown by the formula (1-1) in the resin (A1) is more than 30 mol % and 90 mol % or less, and preferably 40 to 70 mol %.

The above content range enables a film density sufficient to suppress diffusion of an acid during a heat treatment after exposure to be obtained so that a favorable MEEF can be achieved.

If the content of the repeating unit shown by the formula (1-1) is too low, the content of the repeating unit shown by the formula (1-2) is too high. Therefore a film density sufficient to suppress diffusion of an acid during a heat treatment after exposure may not be obtained so that a favorable MEEF may not be achieved.

The content of the repeating unit shown by the formula (1-1) in the resin (A2) that includes the repeating unit shown by the formula (1-1), the repeating unit shown by the formula (1-2), and the repeating unit shown by the formula (1-3) is 10 to 70 mol %, and preferably 20 to 50 mol %.

The above content range enables a film density sufficient to suppress diffusion of an acid during a heat treatment after exposure to be obtained so that a favorable MEEF can be achieved.

If the content of the repeating unit shown by the formula (1-1) is too low, the content of the repeating unit shown by the formula (1-3) and having an acid-dissociable group is too high. Therefore a film density sufficient to suppress diffusion of an acid during a heat treatment after exposure may not be obtained so that a favorable MEEF may not be achieved.

In this embodiment, each of the resin (A1) and the resin (A2) may be used either individually or in combination. The resin (A1) and the resin (A2) are alkali-insoluble or scarcely alkali-soluble, but become alkali-soluble by the action of an acid.

Acid Generator (B)

The acid generator (B) included in the radiation-sensitive resin composition according to this embodiment causes the acid-dissociable group in the resin (A1) or the resin (A2) to dissociate by the action of an acid generated upon exposure. As a result, the exposed area of the resist film becomes readily soluble in an alkaline developer so that a positive-tone resist pattern is formed. The acid generator (B) according to the present invention includes a compound shown by the formula (2).

Examples of the linear or the branched alkyl groups having 1 to 10 carbon atoms represented by $R^8$, $R^9$, and $R^{10}$ in the formula (2) include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like. Among these alkyl groups, a methyl group is preferable.

Examples of the substituted or unsubstituted alicyclic hydrocarbon group having 4 to 12 carbon atoms represented by $R^8$ in the formula (2) include a cyclopropyl group, a cyclobutyl group, a cyclopentyl group, a cyclohexyl group, a cyclooctyl group, and the like. Examples of a substituent for the alicyclic hydrocarbon group include a hydroxyl group, a carboxyl group, a cyano group, a nitro group, an alkoxy group, an alkoxyalkyl group, an alkoxycarbonyl group, an alkoxycarbonyloxy group, and the like.

Among these substituted or unsubstituted alicyclic hydrocarbon groups, a cyclohexyl group is preferable.

Examples of the linear or branched alkoxyl group having 1 to 10 carbon atoms represented by $R^8$ in the formula (2) include a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group, and the like. Among these alkoxyl groups, a methoxy group is preferable.

Examples of the linear or branched alkoxycarbonyl group having 2 to 11 carbon atoms represented by $R^8$ in the formula (2) include a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group, and the like. Among these alkoxycarbonyl groups, a methoxycarbonyl group is preferable.

$R^8$ in the formula (2) is preferably a hydrogen atom, a hydroxyl group, a methoxy group, an ethoxy group, an n-butoxy group, or a cyclohexyl group.

$R^9$ in the formula (2) is preferably a hydrogen atom, a methyl group, or a t-butoxy group.

Examples of the substituted or unsubstituted phenyl group represented by $R^{10}$ in the formula (2) include a phenyl group or a phenyl group substituted with a linear, branched, or cyclic alkyl group having 1 to 10 carbon atoms (e.g., o-tolyl group, m-tolyl group, p-tolyl group, 2,3-dimethylphenyl group, 2,4-dimethylphenyl group, 2,5-dimethylphenyl group, 2,6-dimethylphenyl group, 3,4-dimethylphenyl group, 3,5-dimethylphenyl group, 2,4,6-trimethylphenyl group, or 4-ethylphenyl group); a group obtained by substituting the phenyl group or the alkyl-substituted phenyl group with at least one group (e.g., hydroxyl group, carboxyl group, cyano group, nitro group, alkoxyl group, alkoxyalkyl group, alkoxycarbonyl group, or alkoxycarbonyloxy group); and the like.

Examples of the alkoxyl group as the substituent for the phenyl group or the alkyl-substituted phenyl group include linear, branched, or cyclic alkoxyl groups having 1 to 20 carbon atoms such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group, and the like.

Examples of the alkoxyalkyl group include linear, branched, or cyclic alkoxyalkyl groups having 2 to 21 carbon atoms such as a methoxymethyl group, an ethoxymethyl group, a 1-methoxyethyl group, a 2-methoxyethyl group, a 1-ethoxyethyl group, and a 2-ethoxyethyl group, and the like.

Examples of the alkoxycarbonyl group include linear, branched, or cyclic alkoxycarbonyl groups having 2 to 21 carbon atoms such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group, and the like.

Examples of the alkoxycarbonyloxy group include linear, branched, or cyclic alkoxycarbonyloxy groups having 2 to 21 carbon atoms such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyl group, and a cyclohexyloxycarbonyl group, and the like.

As the substituted or unsubstituted phenyl group represented by $R^{10}$ in the formula (2), a phenyl group, a 4-methoxyphenyl group, a 4-t-butoxyphenyl group, and the like are preferable.

Examples of the substituted or unsubstituted naphthyl group represented by $R^{10}$ in the formula (2) include a naphthyl group and a naphthyl group substituted with a linear, branched, or cyclic alkyl group having 1 to 10 carbon atoms (e.g., 1-naphthyl group, 2-methyl-1-naphthyl group, 3-methyl-1-naphthyl group, 4-methyl-1-naphthyl group, 5-methyl-1-naphthyl group, 6-methyl-1-naphthyl group, 7-methyl-1-naphthyl group, 8-methyl-1-naphthyl group, 2,3-dimethyl-1-naphthyl group, 2,4-dimethyl-1-naphthyl group, 2,5-dimethyl-1-naphthyl group, 2,6-dimethyl-1-naphthyl group, 2,7-dimethyl-1-naphthyl group, 2,8-dimethyl-1-naphthyl group, 3,4-dimethyl-1-naphthyl group, 3,5-dimethyl-1-naphthyl group, 3,6-dimethyl-1-naphthyl group, 3,7-dimethyl-1-naphthyl group, 3,8-dimethyl-1-naphthyl group, 4,5-dimethyl-1-naphthyl group, 5,8-dimethyl-1-naphthyl group, 4-ethyl-1-naphthyl group, 2-naphthyl group, 1-methyl-2-naphthyl group, 3-methyl-2-naphthyl group, and 4-methyl-2-naphthyl group); a group obtained by substituting the naphthyl group or the alkyl-substituted naphthyl group with at least one group (e.g., hydroxyl group, carboxyl group, cyano group, nitro group, alkoxyl group, alkoxyalkyl group, alkoxycarbonyl group, or alkoxycarbonyloxy group); and the like.

Examples of the alkoxyl group, the alkoxyalkyl group, the alkoxycarbonyl group, and the alkoxycarbonyloxy group as the substituent for the naphthyl group and the alkyl-substituted naphthyl group include the groups mentioned for the phenyl group and the alkyl-substituted phenyl group.

As the substituted or unsubstituted naphtyl group represented by $R^{10}$ in the formula (2), a 1-naphthyl group, a 1-(4-methoxynaphthyl) group, a 1-(4-ethoxynaphthyl) group, and a 1-(4-n-butoxynaphthyl) group are preferable.

As the divalent group having 2 to 10 carbon atoms formed when $R^{10}$ in the formula (2) bond to each other, a group that forms a five-membered or six-membered cyclic structure (preferably a five-membered cyclic structure (i.e., tetrahydrothiophene ring structure) together with the sulfur atom in the formula (2) is preferable.

Examples of the substituent for the divalent group include the groups mentioned as the substituents for the phenyl group and the alkyl-substituted phenyl group, such as a hydroxyl group, a carboxyl group, a cyano group, a nitro group, an alkoxyl group, an alkoxyalkyl group, an alkoxycarbonyl group, and an alkoxycarbonyloxy group.

As $R^{10}$ in the formula (2), a methyl group, an ethyl group, a phenyl group, a 4-methoxyphenyl group, a 1-naphthyl group, and a divalent group having a tetrahydrothiophene ring structure formed by $R^{10}$ together with the sulfur atom are preferable.

Specific examples of the substituted or unsubstituted alicyclic hydrocarbon group having 3 to 12 carbon atoms represented by $R^{11}$ that forms $X^-$ in the formula (2) include bicyclo[2.2.1]hept-2-yl (formula (2-1)).

(2-1)

Specific examples of the acid generator (B) include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-bicyclo[2.2.1]hept-2-yl-1,1-difluoroethanesulfonate, 1-naphthyldimethylsulfonium trifluoromethanesulfonate, 1-naphthyldimethylsulfonium nonafluoro-n-butanesulfonate, 1-naphthyldimethylsulfonium perfluoro-n-octanesulfonate, 1-naphthyldiethylsulfonium trifluoromethanesulfonate, 1-naphthyldiethylsulfonium nonafluoro-n-butanesulfonate, 1-naphthyldiethylsulfonium perfluoro-n-octanesulfonate, 4-cyclohexylphenyldiphenylsulfonium nonafluoro-n-butanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-bicyclo[2.2.1]hept-2-yl-1,1-difluoroethanesulfonate, 1-(4-hydroxynaphthyl)dimethylsulfonium trifluoromethanesulfonate, 1-(4-hydroxynaphthyl)dimethylsulfonium nonafluoro-n-butanesulfonate, 1-(4-hydroxynaphthyl)dimethylsulfonium perfluoro-n-octanesulfonate, 1-(4-hydroxynaphthyl)diethylsulfonium trifluoromethanesulfonate, 1-(4-hydroxynaphthyl)diethylsulfonium nonafluoro-n-butanesulfonate, 1-(4-hydroxynaphthyl)diethylsulfonium perfluoro-n-octanesulfonate, 1-(4-methylnaphthyl)dimethylsulfonium trifluoromethanesulfonate, 1-(4-methylnaphthyl)dimethylsulfonium nonafluoro-n-butanesulfonate, 1-(4-methylnaphthyl)dimethylsulfonium perfluoro-n-octanesulfonate, 1-(4-methylnaphthyl)diethylsulfonium trifluoromethanesulfonate, 1-(4-methylnaphthyl)diethylsulfonium nonafluoro-n-butanesulfonate, 1-(4-methylnaphthyl)diethylsulfonium perfluoro-n-octanesulfonate, 1-(4-cyanonaphthyl)dimethylsulfonium trifluoromethanesulfonate, 1-(4-cyanonaphthyl)dimethylsulfonium nonafluoro-n-butanesulfonate, 1-(4-cyanonaphthyl)dimethylsulfonium perfluoro-n-octanesulfonate, 1-(4-cyanonaphthyl)diethylsulfonium trifluoromethanesulfonate, 1-(4-cyanonaphthyl)diethylsulfonium nonafluoro-n-butanesulfonate, 1-(4-cyanonaphthyl)diethylsulfonium perfluoro-n-octanesulfonate, 1-(4-nitronaphthyl)dimethylsulfonium trifluoromethanesulfonate, 1-(4-nitronaphthyl)dimethylsulfonium nonafluoro-n-butanesulfonate, 1-(4-nitronaphthyl)dimethylsulfonium perfluoro-n-octanesulfonate, 1-(4-nitronaphthyl)diethylsulfonium trifluoromethanesulfonate, 1-(4-nitronaphthyl)diethylsulfonium nonafluoro-n-butanesulfonate, 1-(4-nitronaphthyl)diethylsulfonium perfluoro-n-octanesulfonate, 1-(3,5-dimethyl-4-hydroxyphenyl)tetrahydrothiophenium trifluoromethanesulfonate, 1-(3,5-dimethyl-4-hydroxyphenyetetrahydrothiophenium nonafluoro-n-butanesulfonate, 1-(3,5-dimethyl-4-hydroxyphenyetetrahydrothiophenium perfluoro-n-octanesulfonate, 1-(4-methoxynaphthyl)tetrahydrothiophenium trifluoromethanesulfonate, 1-(4-methoxynaphthyl)tetrahydrothiophenium nonafluoro-n-butanesulfonate, 1-(4-methoxynaphthyl)tetrahydrothiophenium perfluoro-n-octanesulfonate, 1-(4-ethoxynaphthyl)tetrahydrothiophenium trifluoromethanesulfonate, 1-(4-ethoxynaphthyl)tetrahydrothiophenium nonafluoro-n-butanesulfonate, 1-(4-ethoxynaphthyl)tetrahydrothiophenium perfluoro-n-octanesulfonate, 1-(4-n-butoxynaphthyl)tetrahydrothiophenium trifluoromethanesulfonate, 1-(4-n-butoxynaphthyl)tetrahydrothiophenium nonafluoro-n-butanesulfonate, 1-(4-n-butoxynaphthyl)tetrahydrothiophenium perfluoro-n-octanesulfonate, 1-(4-n-butoxynaphthyl)tetrahydrothiophenium 2-bicyclo[2.2.1]hept-2-yl-1,1,2,2-tetrafluoroethanesulfonate, 1-(4-n-butoxynaphthyl)tetrahydrothiophenium 2-bicyclo[2.2.1]hept-2-yl-1,1-difluoroethanesulfonate, and the like.

Among these acid generators (B), triphenylsulfonium nonafluoro-n-butanesulfonate, 1-(4-n-butoxynaphthyl)tetrahydrothiophenium nonafluoro-n-butanesulfonate, and 4-cyclohexylphenyldiphenylsulfonium nonafluoro-n-butanesulfonate are preferable.

In the present invention, the acid generators (B) may be used either individually or in combination.

In the present invention, a radiation-sensitive acid generator other than the above-described acid generator (hereinafter referred to as "additional acid generator") may also be used. The acid generator (B) and the additional acid generator may be used in combination.

Examples of the additional acid generator include an onium salt compound, a halogen-containing compound, a diazoketone compound, a sulfone compound, a sulfonic acid compound, and the like.

Examples of these acid generators are given below.
Onium Salt Compound:

Examples of the onium salt compound include an iodonium salt, a sulfonium salt, a phosphonium salt, a diazonium salt, a pyridinium salt, and the like.

Specific examples of the onium salt compound include diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, and the like.

Halogen-Containing Compound:

Examples of the halogen-containing compound include a haloalkyl group-containing hydrocarbon compound, a haloalkyl group-containing heterocyclic compound, and the like.

Specific examples of the halogen-containing compound include (trichloromethyl)-s-triazine derivatives such as phenylbis(trichloromethyl)-s-triazine, 4-methoxyphenylbis(trichloromethyl)-s-triazine, 1-naphthylbis(trichloromethyl)-s-triazine, 1,1-bis(4-chlorophenyl)-2,2,2-trichloroethane, and the like.

Diazoketone Compound:

Examples of the diazoketone compound include a 1,3-diketo-2-diazo compound, a diazobenzoquinone compound, a diazonaphthoquinone compound, and the like.

Specific examples of the diazoketone compound include 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, 1,2-naphthoquinonediazido-4-sulfonate or 1,2-naphthoquinonediazido-5-sulfonate of 1,1,1-tris(4-hydroxyphenyl)ethane, and the like.

Sulfone Compound:

Examples of the sulfone compound include a β-ketosulfone, a β-sulfonylsulfone, α-diazo compounds of these compounds, and the like.

Specific examples of the sulfone compound include 4-trisphenacylsulfone, mesitylphenacylsulfone, bis(phenylsulfonyl)methane, and the like.

Sulfonic Acid Compound:

Examples of the sulfonic acid compound include an alkyl sulfonate, an alkylsulfonic acid imide, a haloalkyl sulfonate, an aryl sulfonate, an imino sulfonate, and the like.

Specific examples of the sulfonic acid compound include benzoin tosylate, tris(trifluoromethanesulfonate) of pyrogallol, nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like.

Among these additional acid generators, diphenyliodonium trifluoromethanesulfonate, diphenyliodonium nonafluoro-n-butanesulfonate, diphenyliodonium perfluoro-n-octanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, cyclohexyl.2-oxocyclohexyl.methylsulfonium trifluoromethanesulfonate, dicyclohexyl.2-oxocyclohexylsulfonium trifluoromethanesulfonate, 2-oxocyclohexyldimethylsulfonium trifluoromethanesulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, N-hydroxysuccinimidetrifluoromethanesulfonate, N-hydroxysuccinimidenonafluoro-n-butanesulfonate, N-hydroxysuccinimideperfluoro-n-octanesulfonate, 1,8-naphthalenedicarboxylic acid imide trifluoromethanesulfonate, and the like are preferable.

These additional acid generators may be used either individually or in combination.

In the present invention, the acid generator (B) is normally used in an amount of 0.1 to 20 parts by mass, and preferably 0.5 to 10 parts by mass, based on 100 parts by mass of the resin (A1) or the resin (A2), from the viewpoint of providing the resist with sensitivity and developability. If the amount of the acid generator (B) is less than 0.1 parts by mass, sensitivity and developability tend to decrease. If the amount of the acid generator (B) exceeds 20 parts by mass, a rectangular resist pattern may not be obtained due to a decrease in transparency to radiation.

When using the acid generator (B) in combination with the additional acid generator, the acid generator (B) is preferably used in an amount of 20 mass % or more, and particularly preferably 40 mass % or more, based on the total amount of the acid generator (B) and the additional acid generator. If the amount of the acid generator (B) is 20 mass % or more, a high resolution can be achieved.

Additives

Various additives such as an acid diffusion controller, an alicyclic additive that has an acid-dissociable group, an alicyclic additive that does not have an acid-dissociable group, a surfactant, and a sensitizer may optionally be added to the radiation-sensitive resin composition according to this embodiment.

The acid diffusion controller controls diffusion of an acid that is generated from the acid generator (B) upon irradiation in the resist film to suppress undesired chemical reactions in the non-irradiated area. The acid diffusion controller improves the storage stability of the resulting radiation-sensitive resin composition, and improves the resolution of the resist. Moreover, the acid diffusion controller prevents a change in line width of the resist pattern due to a change in post-exposure delay (PED) between irradiation and development, so that a composition that exhibits excellent process stability can be obtained. As the acid diffusion controller, it is preferable to use a nitrogen-containing organic compound of which the basicity does not change during irradiation or heating when forming a resist pattern.

Examples of the nitrogen-containing organic compound include a tertiary amine compound, an amide group-containing compound, a quaternary ammonium hydroxide compound, a nitrogen-containing heterocyclic compound, and the like.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyldimethylamine, and tricyclohexylamine; alkanolamines such as triethanolamine and diethanolaniline; N,N,N',N'-tetramethylethylenediamine, N,N,N',N'-tetrakis(2-hydroxypropyl)ethylenediamine, 1,3-bis[1-(4-aminophenyl)-1-methylethyl]benzenetetramethylenediamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, and the like.

Examples of the amide group-containing compound include N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, N-t-butoxycarbonyl-pyrrolidine, N-t-butoxycarbonyl-piperidine, N-t-butoxycarbonyl-4-hydroxypiperidine, and N-t-butoxycarbonylmorpholine; formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the quaternary ammonium hydroxide compound include tetramethylammonium hydroxide, tetraethylammonium hydroxide, tetra-n-propylammonium hydroxide, tetra-n-butylammonium hydroxide, and the like.

Examples of the nitrogen-containing heterocyclic compound include imidazoles such as imidazole, 4-methylimidazole, 1-benzyl-2-methylimidazole, 4-methyl-2-phenylimidazole, benzimidazole, and 2-phenylbenzimidazole; piperazines such as piperazine and 1-(2-hydroxyethyl)piperazine; pyrazine, pyrazole, pyridazine, quinoxaline, and purine; pyrrolidines such as t-butyl-1-pyrrolidine carboxylate; piperidines such as t-butyl-4-hydroxy-1-piperidine carboxylate; 3-piperidino-1,2-propanediol, morpholine, 4-methylmorpholine, 1,4-dimethylpiperazine, 1,4-diazabicyclo[2.2.2]octane; and the like.

Among these nitrogen-containing organic compounds, the tertiary amine compounds, the amide group-containing compounds, and the nitrogen-containing heterocyclic compounds are preferable. Among the amide group-containing compounds, N-t-butoxycarbonyl group-containing amino compounds are particularly preferable. Among the nitrogen-containing heterocyclic compounds, imidazoles are particularly preferable.

These acid diffusion controllers may be used either individually or in combination. The acid diffusion controller is preferably used in an amount of 15 parts by mass or less, more preferably 10 parts by mass or less, and particularly preferably 5 parts by mass or less, based on 100 parts by mass of the resin (A1) or the resin (A2). If the amount of the acid diffusion controller exceeds 15 parts by mass, the sensitivity of the resist and the developability of the irradiated area may decrease. If the amount of the acid diffusion controller is less than 0.001 parts by mass, the pattern shape or the dimensional accuracy of the resist may decrease depending on the process conditions.

The alicyclic additive that has an acid-dissociable group or the alicyclic additive that does not have an acid-dissociable group improves dry etching resistance, the pattern shape, adhesion to a substrate, and the like.

Examples of such alicyclic additives include adamantane derivatives such as t-butyl 1-adamantanecarboxylate, t-butoxycarbonylmethyl 1-adamantanecarboxylate, γ-butyrolactone 1-adamantanecarboxylate, di-t-butyl 1,3-adamantanedicarboxylate, t-butyl 1-adamantaneacetate, t-butoxycarbonylmethyl 1-adamantaneacetate, di-t-butyl 1,3-adamantanediacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkyl carboxylates such as dimethyl adipate, diethyl adipate, dipropyl adipate, di-n-butyl adipate, and di-t-butyl adipate; and the like. These alicyclic additives may be used either individually or in combination. The alicyclic additive is preferably used in an amount of 50 parts by mass or less, and more preferably 30 parts by mass or less, based on 100 parts by mass of the resin (A1) or the resin (A2). If the amount of the alicyclic additive exceeds 50 parts by mass, the heat resistance of the resist tends to decrease.

The surfactant used as the additive improves applicability, striation properties, developability, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate, and commercially available products such as KP341 (manufactured by Shin-Etsu Chemical Co., Ltd.), Polyflow No. 75, No. 95 (manufactured by Kyoeisha Chemical Co., Ltd.), FTOP EF301, EF303, EF352 (manufactured by Tohkem Products Corporation), Megafac F171, F173 (manufactured by Dainippon Ink and Chemicals, Inc.), Fluorad FC430, FC431 (manufactured by Sumitomo 3M Ltd.), Asahi Guard AG710, and Surflon S-382, SC-101, SC-102, SC-103, SC-104, SC-105, SC-106 (manufactured by Asahi Glass Co., Ltd.). The surfactants may be used either individually or in combination. The surfactant is preferably used in an amount of 2 parts by mass or less based on 100 parts by mass of the resin.

Examples of other additives include a halation inhibitor, an adhesion promoter, a storage stabilizer, an anti-foaming agent, and the like.

Method of Producing Resin (A1) or Resin (A2)

A method of producing the resin (A1) or the resin (A2) included in the radiation-sensitive resin composition according to this embodiment is not particularly limited. For example, the resin (A1) or the resin (A2) may be produced by polymerizing a polymerizable unsaturated monomer corresponding to each repeating unit that forms a desired molecular composition in an appropriate solution in the presence of a radical polymerization initiator, a chain transfer agent, and the like. In order to implement a sufficient polymerization rate, the radical polymerization initiator is preferably added in a sufficiently high concentration. If the amount of the radical polymerization initiator is too large with respect to the amount of the chain transfer agent, a radical-radical coupling reaction occurs so that an undesirable non-living radical polymer is produced. As a result, the resulting polymer contains a moiety of which the polymer properties (e.g., molecular weight and molecular weight distribution) are not controlled. The molar ratio of the radical polymerization initiator to the chain transfer agent is preferably 1:1 to 0.005:1.

Examples of the radical polymerization initiator include, but are not limited to, a thermal polymerization initiator, a redox polymerization initiator, and a photoinitiator. Specific examples of the radical polymerization initiator include a peroxide, an azo compound, and the like. More specific examples of the radical polymerization initiators include t-butyl hydroperoxide, t-butyl perbenzoate, benzoylperoxide, 2,2'-azobis(2,4-dimethylvaleronitrile), 2,2'-azobisisobutyronitrile (AIBN), 1,1'-azobis(cyclohexanecarbonitrile), dimethyl-2,2'-azobisisobutyrate (MAIB), and the like.

Examples of the chain transfer agent include a pyrazole derivative, an alkylthiol, and the like.

The polymerization method may be batch polymerization, drip polymerization, or the like. For example, monomers corresponding to the repeating unit shown by the formula (1-1), the repeating unit shown by the formula (1-2), the repeating unit shown by the formula (1-3), and other repeating units are dissolved in an organic solvent in necessary amounts, and polymerized in the presence of the radical polymerization initiator and the chain transfer agent to obtain a copolymer (i.e., resin (A2)). As the polymerization solvent, an organic solvent capable of dissolving the monomers, the radical polymerization initiator, and the chain transfer agent is used. Examples of the organic solvent include a ketone solvent, an ether solvent, an aprotic polar solvent, an ester solvent, an aromatic solvent, and a linear or cyclic aliphatic solvent. Examples of the ketone solvent include methyl ethyl ketone, acetone, and the like. Examples of the ether solvent include alkoxyalkyl ethers such as methoxymethyl ether, ethyl ether, tetrahydrofuran, and 1,4-dioxane. Examples of the aprotic polar solvent include dimethylformamide, dimethyl sulfoxide, and the like. Examples of the ester solvent include alkyl acetates such as ethyl acetate and methyl acetate. Examples of the aromatic solvent include alkylaryl solvents such as toluene and xylene, halogenated aromatic solvents such as chlorobenzene, and the like. Examples of the aliphatic solvent include hexane, cyclohexane, and the like.

The polymerization temperature is normally 20 to 120° C., preferably 50 to 110° C., and more preferably 60 to 100° C. The monomers are preferably polymerized in an inert gas atmosphere (e.g., nitrogen or argon), although the monomers may also be polymerized in a normal atmosphere. The molecular weight of the resin (A1) or the resin (A2) may be adjusted by controlling the ratio of the monomers to the chain transfer agent. The polymerization time is normally 0.5 to 144 hours, preferably 1 to 72 hours, and more preferably 2 to 24 hours.

The resin (A1) or the resin (A2) may or may not have a residue derived from the chain transfer agent on the end of the molecular chain, or a residue derived from the chain transfer agent may partially remain on the end of the molecular chain.

The resin (A1) or the resin (A2) preferably contains only a small amount of impurities (e.g., halogen and metal), and preferably contains residual monomers and oligomer components in an amount equal to or less than a given amount (e.g., 0.1 mass % or less when measured by HPLC). This further improves the sensitivity, the resolution, the process stability, the pattern shape, and the like of the resist, and produces a radiation-sensitive resin composition that can be used as a resist that does not contain foreign matter and shows only a small temporal change in sensitivity and the like.

The resin (A1) or the resin (A2) may be purified by the following method, for example. Specifically, impurities (e.g., metal) may be removed by adsorbing a metal in the solution of the resin (A1) or the resin (A2) using a zeta-potential filter, or chelating a metal by washing the solution of the resin (A1) or the resin (A2) with an acidic aqueous solution (e.g., oxalic acid or sulfonic acid) and removing the metal, for example. Residual monomers and oligomer components may be removed to a concentration equal to or lower than a given concentration by removing residual monomers and oligomer components by washing with water and utilizing an appropriate solvent (liquid-liquid extraction), purification in a solution state such as ultrafiltration that extracts and removes only components having a molecular weight equal to or lower than a given molecular weight, adding the solution of the resin (A1) or the resin (A2) to a poor solvent dropwise so that the resin (A1) or the resin (A2) coagulates in the poor solvent to remove residual monomers and the like (reprecipitation method), or solid-state purification that washes a polymer slurry separated by filtration with a poor solvent, for example. These methods may be used in combination. The poor solvent used in the reprecipitation method may be appropriately selected corresponding to the properties of the resin (A1) or the resin (A2) to be purified, for example.

The polystyrene-reduced weight average molecular weight (hereinafter referred to as "Mw") of the resin (A1) or the resin (A2) determined by gel permeation chromatography (GPC) is normally 1000 to 300,000, preferably 2000 to 300,000, and more preferably 2000 to 12,000. If the Mw of the resin (A1) or the resin (A2) is less than 1000, the heat resistance of the resist may decrease. If the Mw of the resin (A1) or the resin (A2) exceeds 300,000, the developability of the resist may decrease.

The ratio (Mw/Mn) of the Mw to the polystyrene-reduced number average molecular weight (hereinafter referred to as "Mn") of the resin (A1) or the resin (A2) determined by gel permeation chromatography (GPC) is preferably 1 to 5, more preferably 1 to 3, and particularly preferably 1 to 1.6.

The radiation-sensitive resin composition according to this embodiment is dissolved in a solvent so that the total solid content is normally 3 to 50 mass %, and preferably 5 to 25 mass %, and filtered through a filter having a pore size of about 0.2 nm to obtain a radiation-sensitive resin composition solution, for example. Examples of the solvent used to prepare the radiation-sensitive resin composition solution include linear or branched ketones such as 2-pentanone, 2-hexanone, 2-heptanone, and 2-octanone; cyclic ketones such as cyclopentanone and cyclohexanone; propylene glycol monoalkyl ether acetates such as propylene glycol monomethyl ether acetate and propylene glycol monoethyl ether acetate; alkyl 2-hydroxypropionates such as methyl 2-hydroxypropionate and ethyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; ethylene glycol monomethyl ether, ethylene glycol monoethyl ether, diethylene glycol dimethyl ether, diethylene-glycol diethyl ether, ethylene glycol monomethyl ether acetate, ethylene glycol monoethyl ether acetate, propylene glycol monomethyl ether, propylene glycol monoethyl ether, n-butyl acetate, methyl pyruvate, ethyl pyruvate, N-methylpyrrolidone, γ-butyrolactone; and the like.

These solvents may be used either individually or in combination. It is preferable to use at least one compound selected from propylene glycol monomethyl ether acetate, propylene glycol monomethyl ether, 2-heptanone, cyclohexanone, γ-butyrolactone, ethyl 2-hydroxypropionate, and ethyl 3-ethoxypropionate. Cyclohexanone is effective from the viewpoint of solubility. However, it is desirable not to use cyclohexanone due to toxicity.

Formation of Resist Pattern

When forming a resist pattern using the radiation-sensitive resin composition according to the present invention, the composition solution prepared as described above is applied to a substrate (e.g., silicon wafer or aluminum-coated wafer) using an appropriate application method (e.g., rotational coating, cast coating, or roll coating) to form a resist film. The resist film is optionally pre-baked (hereinafter referred to as "PB"), and is exposed through a given pattern mask.

As radiation that can be used for exposure, deep ultraviolet rays such as a mercury lamp line spectrum (wavelength: 254 nm), KrF excimer laser light (wavelength: 248 nm), ArF excimer laser light (wavelength: 193 nm), $F_2$ excimer laser light (wavelength: 157 nm), or EUV light (wavelength: 13 nm), X-rays such as synchrotron radiation, charged particle rays such as electron beams, or the like may be used depending on the type of the acid generator (B). It is preferable to use deep ultraviolet rays or charged particle rays, with KrF excimer laser light (wavelength: 248 nm), ArF excimer laser light (wavelength: 193 nm), and electron beams being particularly preferable. The exposure conditions (e.g., dose) are appropriately selected corresponding to the composition of the radiation-sensitive resin composition, the types of additives, and the like.

It is preferable to perform a heat treatment after exposure (hereinafter referred to as "post-exposure bake (PEB)") in order to improve the apparent sensitivity of the resist. PEB is normally performed at 30 to 200° C., and preferably 50 to 150° C., although the PEB conditions vary depending on the composition of the radiation-sensitive resin composition, the types of additives, and the like.

The exposed resist film is developed using an alkaline developer to form a given resist pattern. As the alkaline developer, an alkaline aqueous solution in which at least one alkaline compound (e.g., alkaline metal hydroxide, aqueous ammonia, alkylamine, alkanolamine, heterocyclic amine, tetraalkylammonium hydroxide, choline, 1,8-diazabicyclo [5.4.0]-7-undecene, or 1,5-diazabicyclo[4.3.0]-5-nonene) is dissolved is used. It is particularly preferable to use an aqueous solution of a tetraalkylammonium hydroxide as the alkaline developer. The concentration of the alkaline aqueous solution is preferably 10 mass % or less, more preferably 1 to 10 mass %, and particularly preferably 2 to 5 mass %. If the concentration of the alkaline aqueous solution is 10 mass % or less, dissolution of the unexposed area in the developer can be suppressed. It is preferable to add an appropriate amount of surfactant or the like to the alkaline developer so that the wettability of the resist with the developer increases. After development using the alkaline developer, the resist film is normally washed with water and dried.

EXAMPLES

The present invention is further described below by way of examples. Note that the present invention is not limited to the following examples. In the examples, the unit "parts" refers to "parts by mass" unless otherwise indicated.

In the examples and comparative examples, the properties were measured and evaluated as follows.

Mw

The Mw was measured by gel permeation chromatography (GPC) using GPC columns manufactured by Tosoh Corp. (G2000HXL×2, G3000HXL×1, G4000HXL×1) at a flow rate of 1.0 ml/min and a column temperature of 40° C. (eluate: tetrahydrofuran, standard: monodispersed polystyrene).

Sensitivity

The composition solution was spin-coated onto a silicon wafer on which an ARC29 film (manufactured by Brewer Science Corp., thickness: 78 nm) was formed, and post-baked on a hot plate under the conditions shown in Table 1 to obtain a resist film having a thickness of 150 nm. The resist film was exposed through a mask pattern using an ArF excimer laser exposure system (manufactured by Nikon Corp., numerical aperture: 0.78). After performing PEB under the conditions shown in Table 1, the resist film was developed using a 2.38 mass % tetramethylammonium hydroxide aqueous solution, washed with water, and dried to form a positive-tone resist pattern. A dose at which a 100 nm hole pattern was formed through a mask having a dimension of 140 nm-hole (hereinafter may be referred to as "H") was taken as the optimum dose.

MEEF

The dimensional difference between resist patterns transferred at the optimum dose through a 136 nmH mask or a 144 nmH mask was divided by the dimensional difference between the masks (144 nm−136 nm=8 nm), and the resulting value was taken as the MEEF. The MEEF is given as follows.

MEEF=dimensional difference between patterns $(A-B)$/dimensional difference between masks A: Dimension (nm) of resist pattern transferred through 144 nmH mask B: Dimension (nm) of resist pattern transferred through 136 nmH mask Resin Synthesis Example 1

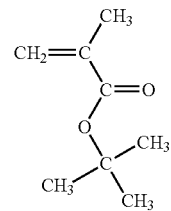
(S1-1)

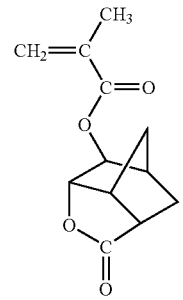
(S1-2)

11.71 g (50 mol %) of a compound (S1-1) and 18.29 g (50 mol %) of a compound (S1-2) were dissolved in 75 g of 2-butanone. 1.35 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 675 g of methanol. A white powder that precipitated by this operation was collected by filtration. The white powder was then washed twice with 135 g of methanol in a slurry state, collected by filtration, and dried at 50° C. for 17 hours to obtain a white powdery copolymer (15.9 g, yield: 53%). The copolymer had an Mw of 7602, and contained repeating units derived from the compound (S1-1) and the compound (S1-2). The ratio of the repeating units derived from the compound (S1-1) and the repeating units derived from the compound (S1-2) was, in this order, 44.8:55.2 (mol %). This copolymer is referred to as "resin (A-1)".

Resin Synthesis Example 2

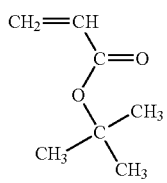
(S2-1)

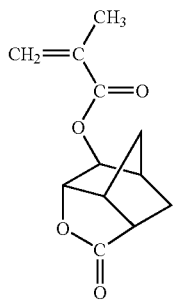
(S2-2)

10.97 g (50 mol %) of a compound (S2-1) and 19.03 g (50 mol %) of a compound (S2-2) were dissolved in 75 g of 2-butanone. 1.41 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 675 g of a heptane-isopropyl alcohol mixed solvent (1:1). A white powder that precipitated by this operation was collected by filtration. The white powder was then washed twice with 135 g of a heptane-isopropyl alcohol mixed solvent (1:1) in a slurry state, collected by filtration, and dried at 50° C. for 17 hours to obtain a white powdery copolymer (22.2 g, yield: 74%). The copolymer had an Mw of 7573, and contained repeating units derived from the compound (S2-1) and the compound (S2-2). The ratio of the repeating units derived from the compound (S2-1) and the repeating units derived from the compound (S2-2) was, in this order, 43.5:56.5 (mol %). This copolymer is referred to as "resin (A-2)".

Resin Synthesis Example 3

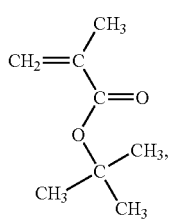
(S3-1)

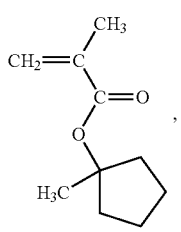
(S3-2)

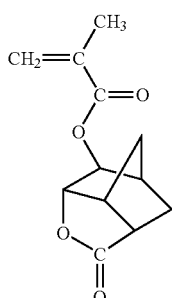
(S3-3)

5.65 g (25 mol %) of a compound (S3-1), 6.99 g (25 mol %) of a compound (S3-2), and 17.66 g (50 mol %) of a compound (S3-3) were dissolved in 60 g of 2-butanone. 1.31 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 600 g of methanol. A white powder that precipitated by this operation was collected by filtration. The white powder was then washed twice with 120 g of methanol in a slurry state, collected by filtration, and dried at 50° C. for 17 hours to obtain a white powdery copolymer (20.1 g, yield: 67%). The copolymer had an Mw of 6810, and contained repeating units derived from the compound (S3-1), the compound (S3-2), and the compound (S3-3). The ratio of the repeating units derived from the compound (S3-1), the repeating units derived from the compound (S3-2), and the repeating units derived from the compound (S3-3) was, in this order, 22.6:23.9:53.5 (mol %). This copolymer is referred to as "resin (A-3)".

Resin Synthesis Example 4

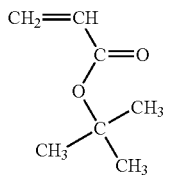
(S4-1)

-continued

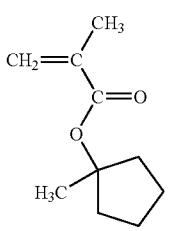
(S4-2)

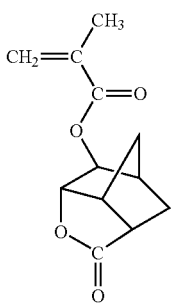
(S4-3)

5.19 g (25 mol %) of a compound (S4-1), 6.81 g (25 mol %) of a compound (S4-2), and 18.00 g (50 mol %) of a compound (S4-3) were dissolved in 60 g of 2-butanone. 1.33 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 600 g of a hexane-isopropyl alcohol mixed solvent (1:1). A white powder that precipitated by this operation was collected by filtration. The white powder was then washed twice with 120 g of a hexane-isopropyl alcohol mixed solvent (1:1) in a slurry state, collected by filtration, and dried at 50° C. for 17 hours to obtain a white powdery copolymer (21.6 g, yield: 72%). The copolymer had an Mw of 6950, and contained repeating units derived from the compound (S4-1), the compound (S4-2), and the compound (S4-3). The ratio of the repeating units derived from the compound (S4-1), the repeating units derived from the compound (S4-2), and the repeating units derived from the compound (S4-3) was, in this order, 24.1:22.2:53.7 (mol %). This copolymer is referred to as "resin (A-4)".

Resin Synthesis Example 5

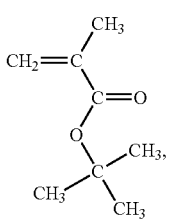
(S5-1)

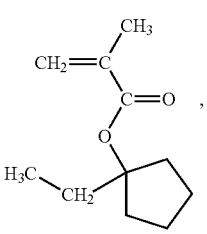
(S5-2)

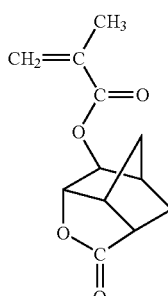
(S5-3)

5.55 g (25 mol %) of a compound (S5-1), 7.11 g (25 mol %) of a compound (S5-2), and 17.34 g (50 mol %) of a compound (S5-3) were dissolved in 60 g of 2-butanone. 1.28 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 600 g of methanol. A white powder that precipitated by this operation was collected by filtration. The white powder was then washed twice with 120 g of methanol in a slurry state, collected by filtration, and dried at 50° C. for 17 hours to obtain a white powdery copolymer (19.8 g, yield: 66%). The copolymer had an Mw of 6703, and contained repeating units derived from the compound (S5-1), the compound (S5-2), and the compound (S5-3). The ratio of the repeating units derived from the compound (S5-1), the repeating units derived from the compound (S5-2), and the repeating units derived from the compound (S5-3) was, in this order, 22.8:21.1:56.1 (mol %). This copolymer is referred to as "resin (A-5)".

Resin Synthesis Example 6

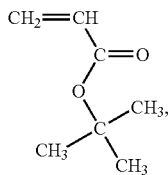
(S6-1)

-continued (S6-2)

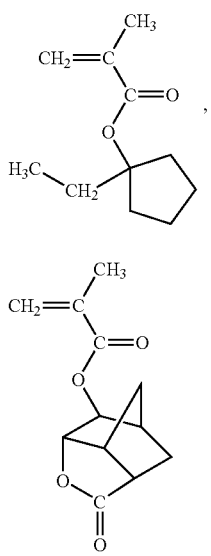

(S6-3)

-continued (S3-2)

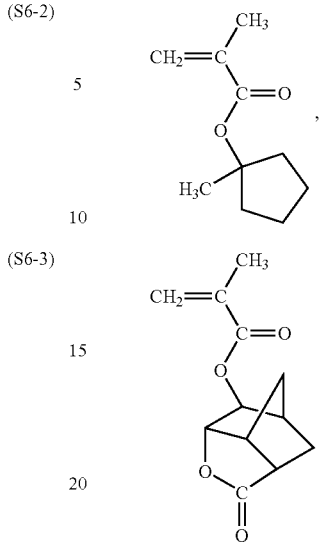

(S3-3)

6.34 g (30 mol %) of a compound (S6-1), 9.01 g (30 mol %) of a compound (S6-2), and 14.65 g (40 mol %) of a compound (S6-3) were dissolved in 60 g of 2-butanone. 1.35 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 600 g of a hexane-isopropyl alcohol mixed solvent (1:1). A white powder that precipitated by this operation was collected by filtration. The white powder was then washed twice with 120 g of a hexane-isopropyl alcohol mixed solvent (1:1) in a slurry state, collected by filtration, and dried at 50° C. for 17 hours to obtain a white powdery copolymer (22.8 g, yield: 76%). The copolymer had an Mw of 7220, and contained repeating units derived from the compound (S6-1), the compound (S6-2), and the compound (S6-3). The ratio of the repeating units derived from the compound (S6-1), the repeating units derived from the compound (S6-2), and the repeating units derived from the compound (S6-3) was, in this order, 27.5: 26.2:46.3 (mol %). This copolymer is referred to as "resin (A-6)".

3.86 g (17 mol %) of a compound (S3-1), 10.20 g (38 mol %) of a compound (S3-2), and 15.95 g (45 mol %) of a compound (S3-3) were dissolved in 60 g of 2-butanone. 1.31 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 600 g of methanol. A white powder that precipitated by this operation was collected by filtration. The white powder was then washed twice with 120 g of methanol in a slurry state, collected by filtration, and dried at 50° C. for 17 hours to obtain a white powdery copolymer (20.4 g, yield: 68%). The copolymer had an Mw of 7570, and contained repeating units derived from the compound (S3-1), the compound (S3-2), and the compound (S3-3). The ratio of the repeating units derived from the compound (S3-1), the repeating units derived from the compound (S3-2), and the repeating units derived from the compound (S3-3) was, in this order, 37.6: 15.9:46.5 (mol %). This copolymer is referred to as "resin (A-7)".

Resin Synthesis Example 7

(S3-1)

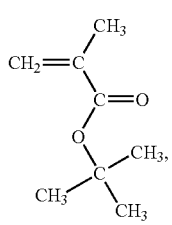

Resin Synthesis Example 8

(S7-1)

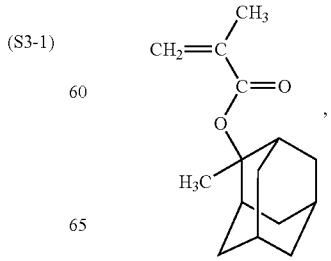

-continued (S7-2)

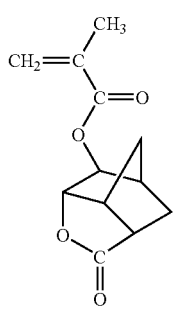

18.38 g (60 mol %) of a compound (S7-1) and 11.62 g (40 mol %) of a compound (S7-2) were dissolved in 60 g of 2-butanone. 1.07 g of 2,2'-azobisisobutylonitrile was added to the solution to prepare a monomer solution. A three-necked flask (500 ml) charged with 30 g of 2-butanone was purged with nitrogen for 30 minutes. The flask was then heated to 80° C. with stirring, and the monomer solution was added dropwise to the flask using a dripping funnel at a rate of 10 ml/5 min. The monomers were polymerized for six hours in total. After completion of polymerization, the resulting polymer solution was cooled with water to 30° C. or less, and poured into 600 g of methanol. A white powder that precipitated by this operation was collected by filtration. The white powder was then washed twice with 120 g of methanol in a slurry state, collected by filtration, and dried at 50° C. for 17 hours to obtain a white powdery copolymer (24.3 g, yield: 81%). The copolymer had an Mw of 5720, and contained repeating units derived from the compound (S7-1) and the compound (S7-2). The ratio of the repeating units derived from the compound (S7-1) and the repeating units derived from the compound (S7-2) was, in this order, 55.0:45.0 (mol %). This copolymer is referred to as "resin (A-8)".

Examples 1 to 10 and Comparative Example 1

Radiation-sensitive resin compositions of Examples 1 to 10 and Comparative Example 1 were prepared. Components other than the resins (A-1) to (A-8) are shown below together with the chemical formulas. The composition of each radiation-sensitive resin composition is shown in Table 1.

Acid Generator (B)

(B-1): 1-(4-n-butoxynaphthalen-1-yl)tetrahydrothiophenium nonafluoro-n-butanesulfonate

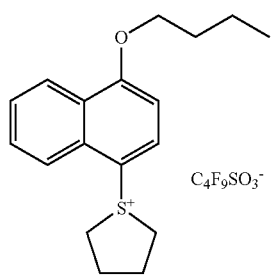

(B-2): 4-cyclohexylphenyldiphenylsulfonium nonafluoro-n-butanesulfonate

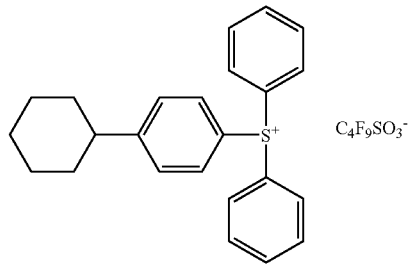

Acid Diffusion Controller (C)

(C-1): t-butyl-4-hydroxy-1-piperidinecarboxylate

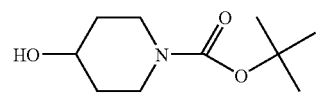

Additive (D)

(D-1): t-butoxycarbonylmethyl lithocholate

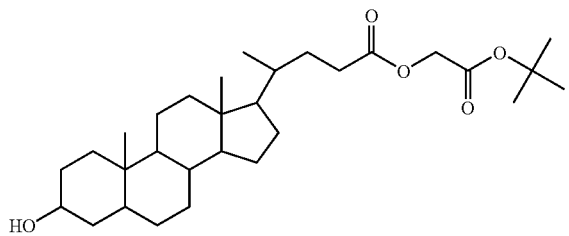 [SMILES: CC(CCC(=O)OCC(=O)OC(C)(C)C)C1CCC2C3CCC4CC(O)CCC4(C)C3CCC12C]

Solvent (E)

(E-1): propylene glycol monomethyl ether acetate

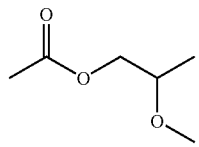

(E-2): cyclohexanone

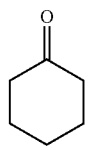

TABLE 1

| | Resin composition | | | | | | | Properties | |
|---|---|---|---|---|---|---|---|---|---|
| | Resin | Acid generator | Acid diffusion controller | Additive | Solvent | PB conditions | PEB conditions | Sensitivity ($J/m^2$) | MEEF |
| Example 1 | A-1(100) | B-1(8) | C-1(0.40) | D-1(4) | E-1(1300) E-2(550) | 100° C. 60 sec | 130° C. 60 sec | 450 | 3.8 |
| Example 2 | A-2(100) | B-1(8) | C-1(0.40) | D-1(4) | E 1(1300) E-2(550) | 90° C. 60 sec | 130° C. 60 sec | 440 | 4.2 |
| Example 3 | A-3(100) | B-1(8) | C-1(0.40) | D-1(4) | E 1(1300) E-2(550) | 100° C. 60 sec | 130° C. 60 sec | 420 | 4.2 |
| Example 4 | A-4(100) | B-1(8) | C-1(0.40) | D-1(4) | E-1(1300) E-2(550) | 90° C. 60 sec | 130° C. 60 sec | 410 | 4.4 |
| Example 5 | A-5(100) | B-1(8) | C-1(0.40) | D-1(4) | E-1(1300) E-2(550) | 100° C. 60 sec | 130° C. 60 sec | 390 | 4.3 |
| Example 6 | A-6(100) | B-1(8) | C-1(0.40) | D-1(4) | E 1(1300) E-2(550) | 90° C. 60 sec | 130° C. 60 sec | 370 | 4.7 |
| Example 7 | A-3(100) | B-2(8.6) | C-1(0.65) | D-1(4) | E-1(1300) E 2(550) | 100° C. 60 sec | 130° C. 60 sec | 410 | 3.9 |
| Example 8 | A-4(100) | B-2(8.6) | C-1(0.65) | D-1(4) | E-1(1300) E-2(550) | 90° C. 60 sec | 130° C. 60 sec | 420 | 4.2 |
| Example 9 | A-7(100) | B-1(8) | C-1(0.40) | D-1(4) | E-1(1300) E-2(550) | 100° C. 60 sec | 130° C. 60 sec | 440 | 3.8 |
| Example 10 | A-7(100) | B-2(8.6) | C-1(0.65) | D-1(4) | E-1(1300) E-2(550) | 100° C. 60 sec | 120° C. 60 sec | 430 | 3.7 |
| Comparative Example 1 | A-8(100) | B-1(8) | C-1(0.40) | D-1(4) | E-1(1300) E-2(550) | 100° C. 60 sec | 130° C. 60 sec | 380 | 5.8 |

As shown in Table 1, the radiation-sensitive resin compositions of Examples 1 to 10 exhibited excellent sensitivity and a small MEEF. On the other hand, since the radiation-sensitive resin composition of Comparative Example 1 was produced using a resin that did not contain the repeating unit shown by the formula (1-1), the radiation-sensitive resin composition of Comparative Example 1 exhibited a large MEEF as compared with the radiation-sensitive resin compositions of Examples 1 to 10, although the sensitivity was almost equal to those of the radiation-sensitive resin compositions of Examples 1 to 10.

INDUSTRIAL APPLICABILITY

Since the radiation-sensitive resin composition according to the present invention can reduce the MEEF, the radiation-sensitive resin composition according to the present invention may be suitably used as a chemically-amplified resist that is useful for microfabrication utilizing various types of radiation (e.g., deep ultraviolet rays such as KrF excimer laser light and ArF excimer laser light, X-rays such as synchrotron radiation, and charged particle rays such as electron beams). Therefore, the radiation-sensitive resin composition according to the present invention may be suitably used in the production of semiconductor devices that are expected to be further miniaturized.

The invention claimed is:

1. A radiation-sensitive resin composition comprising a resin (A2) that comprises a repeating unit shown by the following formula (1-1), a repeating unit shown by the following formula (1-2), and a repeating unit shown by the following formula (1-3), and a radiation-sensitive acid generator (B),

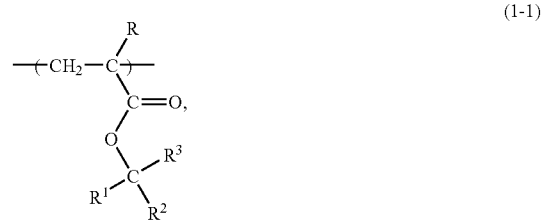

(1-1)

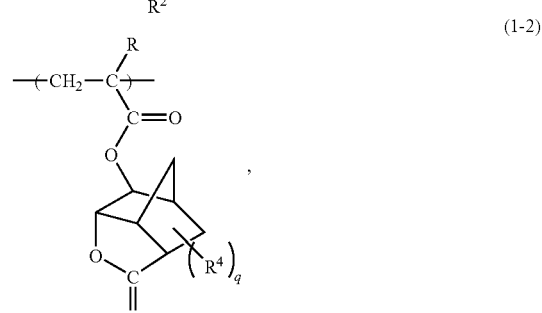

(1-2)

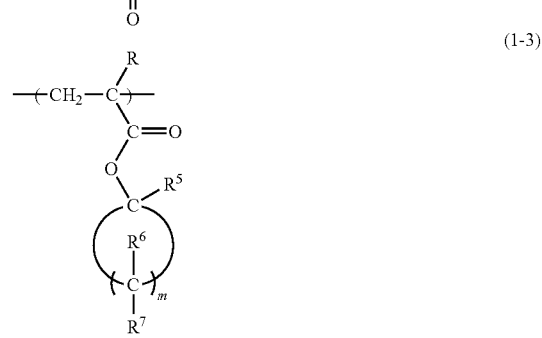

(1-3)

wherein R represents a hydrogen atom, a methyl group, or a trifluoromethyl group, $R^1$, $R^2$, and $R^3$ individually represent linear or branched alkyl groups having 1 to 4 carbon atoms, $R^4$ represents a hydrogen atom, a linear or branched alkyl group having 1 to 4 carbon atoms, a linear or branched fluoroalkyl group having 1 to 4 carbon atoms, or a linear or branched alkoxy group having 1 to 4 carbon atoms, q represents an integer from 0 to 3, $R^5$ represents a linear or branched alkyl group having 1 to 4 carbon atoms, $R^6$ and $R^7$ individually represent a hydrogen atom or a linear or branched alkyl group having 1 to 4 carbon atoms, and m represents an integer from 3 to 7.

2. The radiation-sensitive resin composition according to claim 1, wherein the content of the repeating unit shown by the formula (1-1) in the resin (A2) is 10 to 70 mol %.

3. The radiation-sensitive resin composition according to claim 1, wherein the resin (A2) consists of the repeating unit shown by the formula (1-1), the repeating unit shown by the formula (1-2), and the repeating unit shown by the formula (1-3), and the content of the repeating unit shown by the formula (1-1) in the resin (A2) is 20 to 50 mol %.

4. The radiation-sensitive resin composition according to claim 1, wherein R in the formula (1-1) is a hydrogen atom or a methyl group, and $R^1$, $R^2$, and $R^3$ in the formula (1-1) are methyl groups.

5. The radiation-sensitive resin composition according to any one of claims 1 to 4, wherein the radiation-sensitive acid generator (B) comprises a compound shown by the following formula (2),

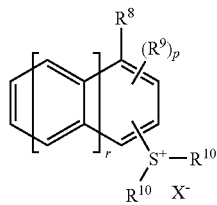

(2)

wherein $R^8$ represents a hydrogen atom, a hydroxyl group, a linear or branched alkyl group having 1 to 10 carbon atoms, a substituted or unsubstituted alicyclic hydrocarbon group having 4 to 12 carbon atoms, a linear or branched alkoxyl group having 1 to 10 carbon atoms, or a linear or branched alkoxycarbonyl group having 2 to 11 carbon atoms, $R^9$ represents a hydrogen atom or a linear or branched alkyl group having 1 to 10 carbon atoms, p represents an integer from 0 to 3, $R^{10}$ individually represent a linear or branched alkyl group having 1 to 10 carbon atoms, a substituted or unsubstituted phenyl group, or a substituted or unsubstituted naphthyl group, or bond to form a substituted or unsubstituted divalent group having 2 to 10 carbon atoms, r represents an integer from 0 to 2, and $X^-$ represents $R^{11}C_nF_{2n}SO_3^-$, $R^{11}CH_2C_nF_{2n}SO_3^-$, or $C_nF_{2n+1}SO_3^-$ (wherein $R^{11}$ represents a substituted or unsubstituted alicyclic hydrocarbon group having 3 to 12 carbon atoms, and n represents an integer from 1 to 10).

6. The radiation-sensitive resin composition according to claim 5, wherein the radiation-sensitive acid generator (B) is at least one compound selected from triphenylsulfonium nonafluoro-n-butanesulfonate, 1-(4-n-butoxynaphthyl)tetrahydrothiophenium tetrahydrothiophenium nonafluoro-n-butanesulfonate, and 4-cyclohexylphenyldiphenylsulfonium nonafluoro-n-butanesulfonate.

7. A radiation-sensitive resin composition comprising:
a resin (A2) that consists essentially of a repeating unit shown by the following formula (1-1), a repeating unit shown by the following formula (1-2), and a repeating unit shown by the following formula (1-3), and
a radiation-sensitive acid generator (B),

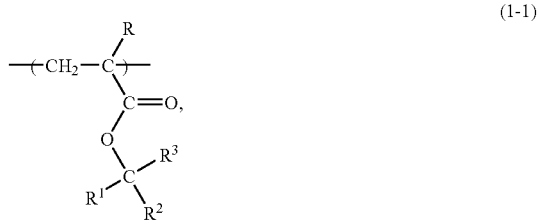

(1-1)

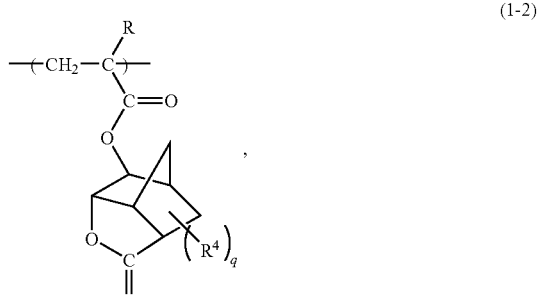

(1-2)

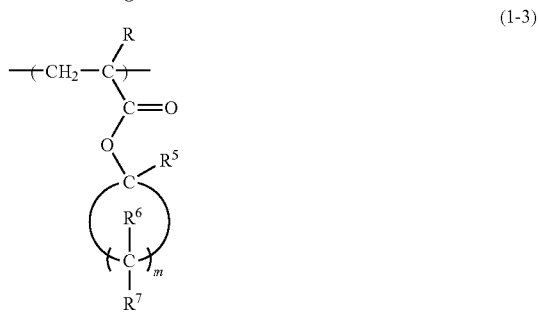

(1-3)

wherein R represents a hydrogen atom, a methyl group, or a trifluoromethyl group, $R^1$, $R^2$, and $R^3$ individually represent linear or branched alkyl groups having 1 to 4 carbon atoms, $R^4$ represents a hydrogen atom, a linear or branched alkyl group having 1 to 4 carbon atoms, a linear or branched fluoroalkyl group having 1 to 4 carbon atoms, or a linear or branched alkoxy group having 1 to 4 carbon atoms, q represents an integer from 0 to 3, $R^5$ represents a linear or branched alkyl group having 1 to 4 carbon atoms, $R^6$ and $R^7$ individually represent a hydrogen atom or a linear or branched alkyl group having 1 to 4 carbon atoms, and m represents an integer from 3 to 7.

* * * * *